(12) United States Patent
Kwon

(10) Patent No.: US 8,375,576 B2
(45) Date of Patent: *Feb. 19, 2013

(54) METHOD FOR MANUFACTURING WAFER SCALE HEAT SLUG SYSTEM

(75) Inventor: Hyeog Chan Kwon, Seoul (KR)

(73) Assignee: STATS Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/161,008

(22) Filed: Jun. 15, 2011

(65) Prior Publication Data

US 2011/0239459 A1 Oct. 6, 2011

Related U.S. Application Data

(62) Division of application No. 11/379,011, filed on Apr. 17, 2006, now Pat. No. 7,975,377.

(60) Provisional application No. 60/594,687, filed on Apr. 28, 2005.

(51) Int. Cl.
*H05K 3/36* (2006.01)
*H05K 1/11* (2006.01)
*H05K 7/00* (2006.01)
*H01L 23/433* (2006.01)

(52) U.S. Cl. ............... 29/830; 29/832; 29/837; 438/122; 257/720; 361/760; 361/761; 174/261

(58) Field of Classification Search .................. 438/113, 438/110–112, 122–124, 127; 257/713, 720; 29/832–834, 855–856, 830, 837; 174/261; 361/760, 761

See application file for complete search history.

(56) References Cited

U.S. PATENT DOCUMENTS

| | | | |
|---|---|---|---|
| 5,625,228 | A | 4/1997 | Rogren |
| 6,399,463 | B1 | 6/2002 | Glenn et al. |
| 6,444,498 | B1 | 9/2002 | Huang et al. |
| 6,849,940 | B1 * | 2/2005 | Chan et al. ............. 257/706 |
| 6,916,688 | B1 | 7/2005 | Kelkar et al. |
| 6,918,178 | B2 | 7/2005 | Chao et al. |
| 6,920,688 | B2 | 7/2005 | Corisis |
| 6,937,044 | B1 | 8/2005 | Agahdel et al. |
| 7,517,729 | B2 * | 4/2009 | Lee et al. .............. 438/122 |
| 7,975,377 | B2 * | 7/2011 | Kwon ................. 29/830 |
| 2002/0105072 | A1 | 8/2002 | Huang |
| 2003/0060032 | A1 | 3/2003 | Beroz et al. |
| 2003/0106212 | A1 | 6/2003 | Chao et al. |
| 2003/0162322 | A1 | 8/2003 | Chen et al. |
| 2004/0172817 | A1 | 9/2004 | Gleason |

\* cited by examiner

*Primary Examiner* — Derris Banks
*Assistant Examiner* — Kaying Kue
(74) *Attorney, Agent, or Firm* — Ishimaru & Associates; Mikio Ishimaru

(57) ABSTRACT

A method for manufacturing a wafer scale heat slug system includes: dicing an integrated circuit from a semiconductor wafer; forming a heat slug blank equivalent in size to the semiconductor wafer; dicing the heat slug blank to produce a heat slug equivalent in size to the integrated circuit; attaching the integrated circuit to a substrate; attaching the heat slug to the integrated circuit; and encapsulating the integrated circuit.

7 Claims, 3 Drawing Sheets

METHOD FOR MANUFACTURING WAFER SCALE HEAT SLUG SYSTEM

CROSS-REFERENCE TO RELATED APPLICATION(S)

This application is a divisional of U.S. patent application Ser. No. 11/379,011 filed Apr. 17, 2006, now U.S. Pat. No. 7,975,377, which claims the benefit of U.S. Provisional Patent Application Ser. No. 60/594,687 filed Apr. 28, 2005, and the subject matter thereof is hereby incorporated herein by reference thereto.

TECHNICAL FIELD

The present invention relates generally to integrated circuit package systems, and more particularly to a system for wafer scale heat slug.

BACKGROUND ART

An integrated circuit (IC) die is often fabricated into a microelectronic device such as a microprocessor. The increasing power consumption of microprocessors results in tighter thermal constraints for a thermal solution design when the microprocessor is employed in the field. If the transistors of the integrated circuit get too hot they can be damaged. Accordingly, a thermal interface is often needed to allow the integrated circuit to release heat more efficiently. A thermal interface can include such things as a heat sink or fan.

Various techniques have been employed to transfer heat away from a die. These techniques include passive and active configurations. One passive configuration involves a conductive material in thermal contact with the backside of a packaged die. This conductive material is often a slug, a heat spreader, or an integrated heat spreader (IHS).

A heat spreader is employed to spread and dissipate the heat generated by a die, which minimizes concentrated high-heat locations within the die. A heat spreader is attached proximately to the back side of a microelectronic die with a thermally conductive material, such as a thermal interface material (TIM). A TIM can include, for example, thermally conductive gels, thermal greases, or solders. Heat spreaders include materials such as aluminum, copper, copper alloy, or ceramic, among others.

With conventional technology, a packaged microelectronic device includes a die which is bonded from the back side to an integrated heat spreader (IHS). An IHS adhesive layer acts as a TIM to bond the die to the IHS. The conventional IHS includes a lip portion that is formed by a bending process which gives rise to less than complete filling into the corner of the bend. Additionally to form the lip portion of the IHS from a rectangular blank, several stamping processes are required to deliver sufficiently flat upper and lower surfaces to achieve quality bonds with other structures such as heat sinks and dies, respectively. These stamping processes result in a relatively low yield in the production of heat spreaders, due, at least in part, to the processes used for forming heat spreaders. Additionally, the stamping processes result in a significant variation in flatness of the top surface of the IHS, as well as the bottom surface. The surface flatness can detrimentally affect adhesion to either side of the IHS.

The current IHS, typically manufactured from a high purity copper alloy, is difficult to form with existing stamping equipment limitations, especially with respect to maintaining high raw material yield metrics and fully-filled corner geometries that are achieved with the stamping process. In order to completely fill the corner locations of the IHS, typical industry raw material yields range as low as 35%, yet utilize multi-stage manufacturing with high-tonnage machinery. The surface flatness is a large contributor to the fall-out and yield problems. Thus far the manufacture of finished packages with heat spreaders has been expensive and time consuming.

Thus, a need still remains for a wafer scale heat slug system that can deliver good thermal performance, package integrity and can use existing assembly tools. In view of the ever increasing performance and shrinking space for integrated circuits, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing a wafer scale heat slug system including: dicing an integrated circuit from a semiconductor wafer; forming a heat slug blank equivalent in size to the semiconductor wafer; dicing the heat slug blank to produce a heat slug equivalent in size to the integrated circuit; attaching the integrated circuit to a substrate; attaching the heat slug to the integrated circuit; and encapsulating the integrated circuit.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
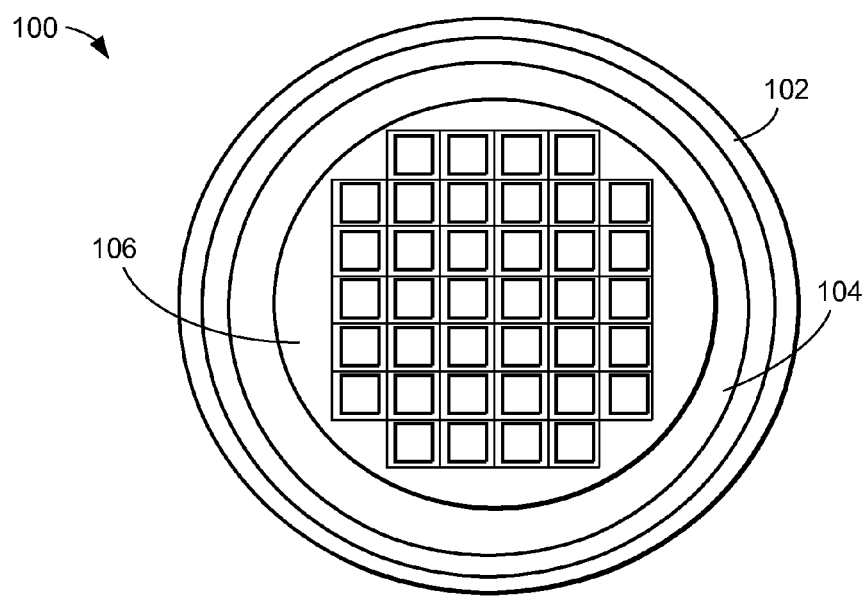
FIG. 1 is a top view of a wafer scale heat slug system, in a wafer mounting process, in an embodiment of the present invention.

In the following description, numerous specific details are given to provide a thorough understanding of the invention. However, it will be apparent that the invention may be practiced without these specific details. In order to avoid obscuring the present invention, some well-known process steps are not disclosed in detail.

Likewise, the drawings showing embodiments of the apparatus are semi-diagrammatic and not to scale and, particularly, some of the dimensions are for the clarity of presentation and are shown greatly exaggerated in the drawing FIGs. Also, where multiple embodiments are disclosed and described, having some features in common, for clarity and ease of illustration, description, and comprehension thereof, similar and like features one to another will ordinarily be described with like reference numerals.

The term "horizontal" as used herein is defined as a plane parallel to the conventional plane or surface of the heat slug, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a top view of a wafer scale heat slug system 100, in a wafer scale mounting process, in an embodiment of the present invention. The top view depicts a wafer frame 102, a dicing tape 104 and a heat slug blank 106.

The heat slug blank 106 is bonded on to the dicing tape 104. The dicing tape 104 may be of a type used with semiconductor wafers and maintains the substantially fixed position of the heat slug blank 106 during the dicing with a saw (not shown). At the completion of the dicing process, the dicing tape 104 is exposed to one of several release processes, such as ultraviolet (UV) release, though it is understood that several other removal processes could be used on the dicing tape 104. In the UV release process the dicing tape 104 is exposed to UV light for a period of time causing the adhesive of the dicing tape 104 to release the singulated parts of the heat slug blank 106.

Figure 2A:
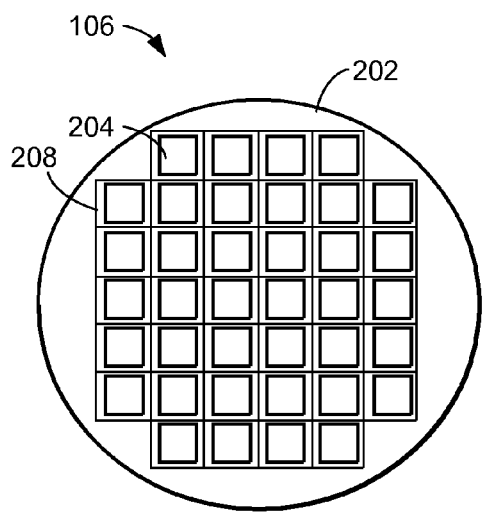
FIG. 2A is a top view of the heat slug blank, in an embodiment of the present invention.

Referring now to FIG. 2A, therein is shown a top view of the heat slug blank 106, in an embodiment of the present invention. The top view of the heat slug blank 106 depicts a heat slug top 202 having a heat slug pedestal 204 arranged in an array on the heat slug top 202. The heat slug blank 106 is fabricated by stamping and cold forging or chemically etching a blank sheet of thermally conductive material, such as aluminum, copper, copper alloy or other thermally conductive material.

The heat slug pedestal 204 is specially designed with dimensions for predetermined integrated circuits. The dimensions and position of the heat slug pedestal 204 are tightly controlled during the cold forging process then may be etched to substantially equivalent dimensions of chip scale precision. This provides maximum area interface between the heat slug pedestal 204 and the surface of the integrated circuit for maximum heat transfer.

A saw guide 208 is pressed in, during the cold forging process, or chemically etched into the heat slug top 202. The thickness of the heat slug top 202 within the area of the saw guide 208 is thinner than the surrounding area of the heat slug top 202. The saw guide 208 is used as an aid during the dicing process for a laser or dicing saw alignment and to reduce the dicing saw wear, during the singulation process.

Figure 2B:
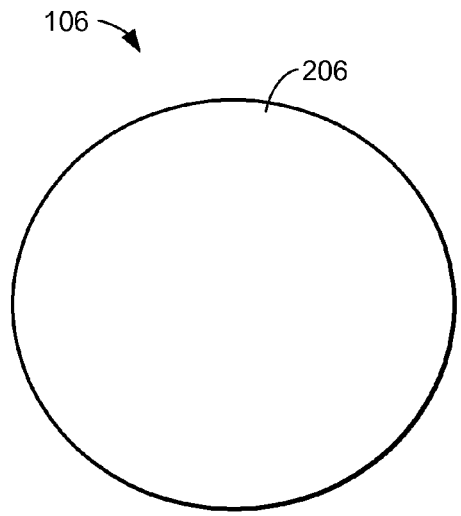
FIG. 2B is a bottom view of the heat slug blank of FIG. 2A.

Referring now to FIG. 2B, therein is shown a bottom view of the heat slug blank 106 of FIG. 2A. The bottom view of the heat slug blank 106 depicts a heat slug back 206 that is substantially planar. The heat slug blank 106 is fabricated by stamping and cold forging or chemically etching a blank sheet of thermally conductive material, such as aluminum, copper, copper alloy or other thermally conductive material.

Figure 3:
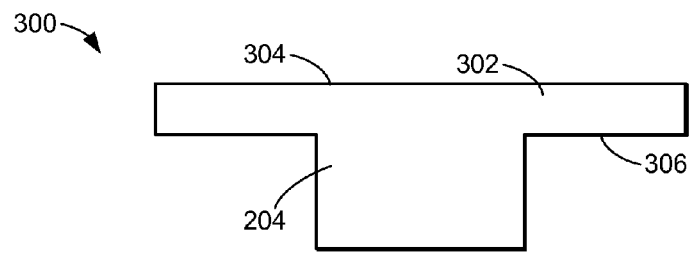
FIG. 3 is a cross-sectional view of a heat slug.

Referring now to FIG. 3, therein is a cross-sectional view of a heat slug 300. The heat slug 300 is one part of the heat slug blank 106 of FIG. 1 in a singulated state. The cross-sectional view depicts the heat slug 300 having a heat spreader 302 on the heat slug pedestal 204. The heat spreader 302 has two sides, a spreader top side 304 and a spreader pedestal side 306. The relative sizes of the heat spreader 302 and the heat slug pedestal 204 are exemplary, and it is understood that the size and thickness of the heat spreader 302 and the precise dimensions of the heat slug pedestal 204 are independent of each other. The dimensions of the heat slug pedestal 204 are determined by the dimensions of a target integrated circuit. In general the heat spreader 302 may be wider than the heat slug pedestal 204.

The larger surface area of the spreader top side 304 and the exposure to the ambient air establishes a heat gradient in the heat slug 300. Heat generated by a chip in contact with the heat slug pedestal 204 is drawn into the heat slug pedestal 204 and moves to the heat spreader 302 for transfer to the ambient air. The precise dimensions of the heat slug pedestal are set to provide as much surface contact as possible with the target integrated circuit.

Figure 4:
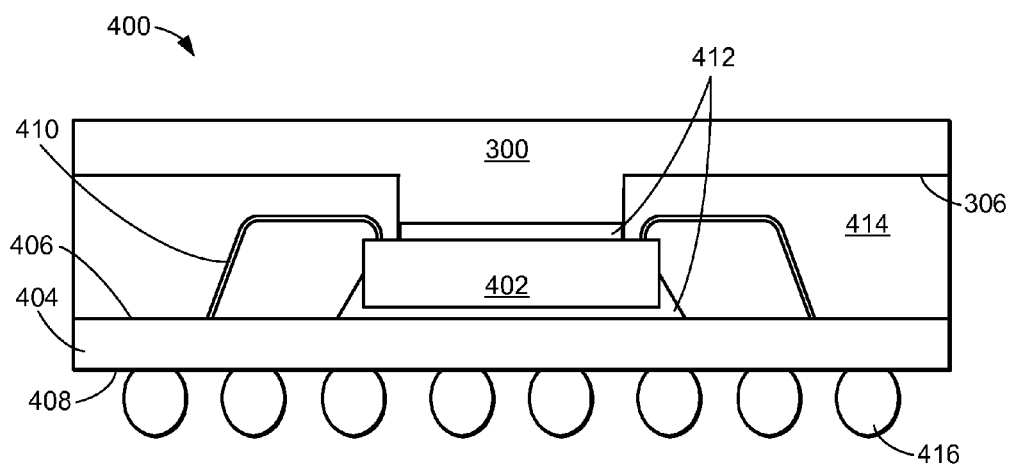
FIG. 4 is a cross-sectional view of the heat slug, mounted in an integrated circuit package assembly, in an embodiment of the present invention.

Referring now to FIG. 4 therein is shown a cross-sectional view of the heat slug 300, mounted in an integrated circuit package assembly 400, in an embodiment of the present invention. The cross-sectional view depicts an integrated circuit 402 mounted on a substrate 404, having a substrate top 406 and a substrate bottom 408, and bond wires 410 electrically attaching the integrated circuit 402 to the substrate top 406. A thermal interface material 412 (TIM), such as a die attach adhesive or thermal epoxy, is used to attach the heat slug 300 to the integrated circuit 402. A molding compound 414 is injected into the space between the substrate top 406 and the spreader pedestal side 306 to encapsulate and protect the integrated circuit 402 and the bond wires 410. The molding compound 414 establishes structural integrity for the integrated circuit package assembly 400 as well. Electrical interface structures 416, such as solder balls, are attached to the substrate bottom 408 for connection to the next level of system (not shown).

The heat slug 300 provides a direct thermal path from the integrated circuit 402 to the ambient air. By attaching directly to the integrated circuit 402, the heat slug 300 allows for maximum heat transfer out of the integrated circuit 402. During the assembly process the heat slug 300 is mounted in a manner similar to the first integrated circuit. The die attach machine used to attach the integrated circuit 402 is also used to apply the thermal interface material 412 and attach the heat slug 300.

Figure 5:
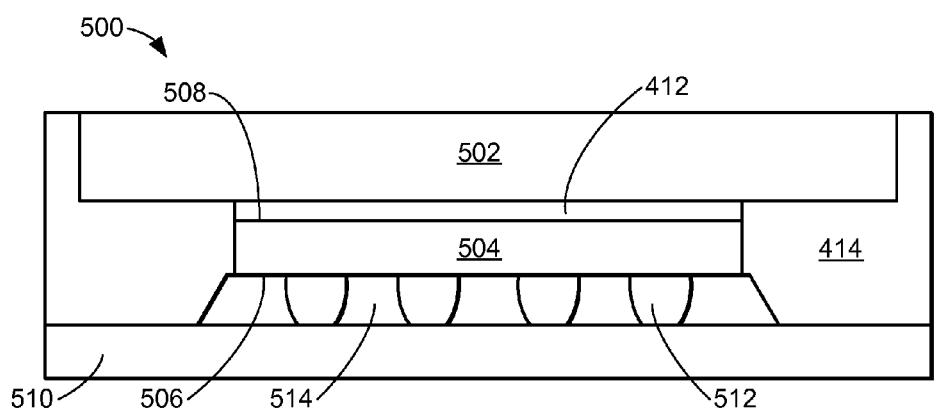
FIG. 5 is a cross-sectional view of an integrated circuit package system with a heat spreader in an alternative embodiment of the present invention.

Referring now to FIG. 5, therein is shown a cross-sectional view of an integrated circuit package assembly 500 with a heat spreader 502 in an alternative embodiment of the present invention. The heat spreader 502 is a flat, wafer scale heat slug. The cross-sectional view depicts the integrated circuit package assembly 500, such as a QFN package, having the heat spreader 502 mounted on an integrated circuit 504, having an active side 506 and an inactive side 508. The integrated circuit 504 is flip chip mounted and electrically connected to a QFN substrate 510. Electrical interconnects 512, such as solder balls, physically and thermally connect the active side 506 of the integrated circuit 504 to the QFN substrate 510. An under-fill material 514 is injected between the QFN substrate 510 and the active side 506 of the integrated circuit 504. The thermal interface material 412 is used to attach the heat spreader 502 to the inactive side 508 of the integrated circuit 504.

The heat spreader 502 is fabricated by stamping and cold forging or chemically etching a blank sheet of thermally conductive material, such as aluminum, copper, copper alloy or other thermally conductive material. The saw guide 208 is pressed in, during the cold forging process, or chemically etched into the heat slug top 202. The heat spreader 502 is singulated from the wafer scale heat slug system 100 by the dicing process.

One side of the heat spreader 502 is exposed to the ambient air while the other side is attached to the integrated circuit 504. The molding compound 414 is injected into the space between the QFN substrate 510 and the heat spreader 502, giving the integrated circuit package assembly 500, structural integrity and protecting the integrated circuit 504.

Figure 6:
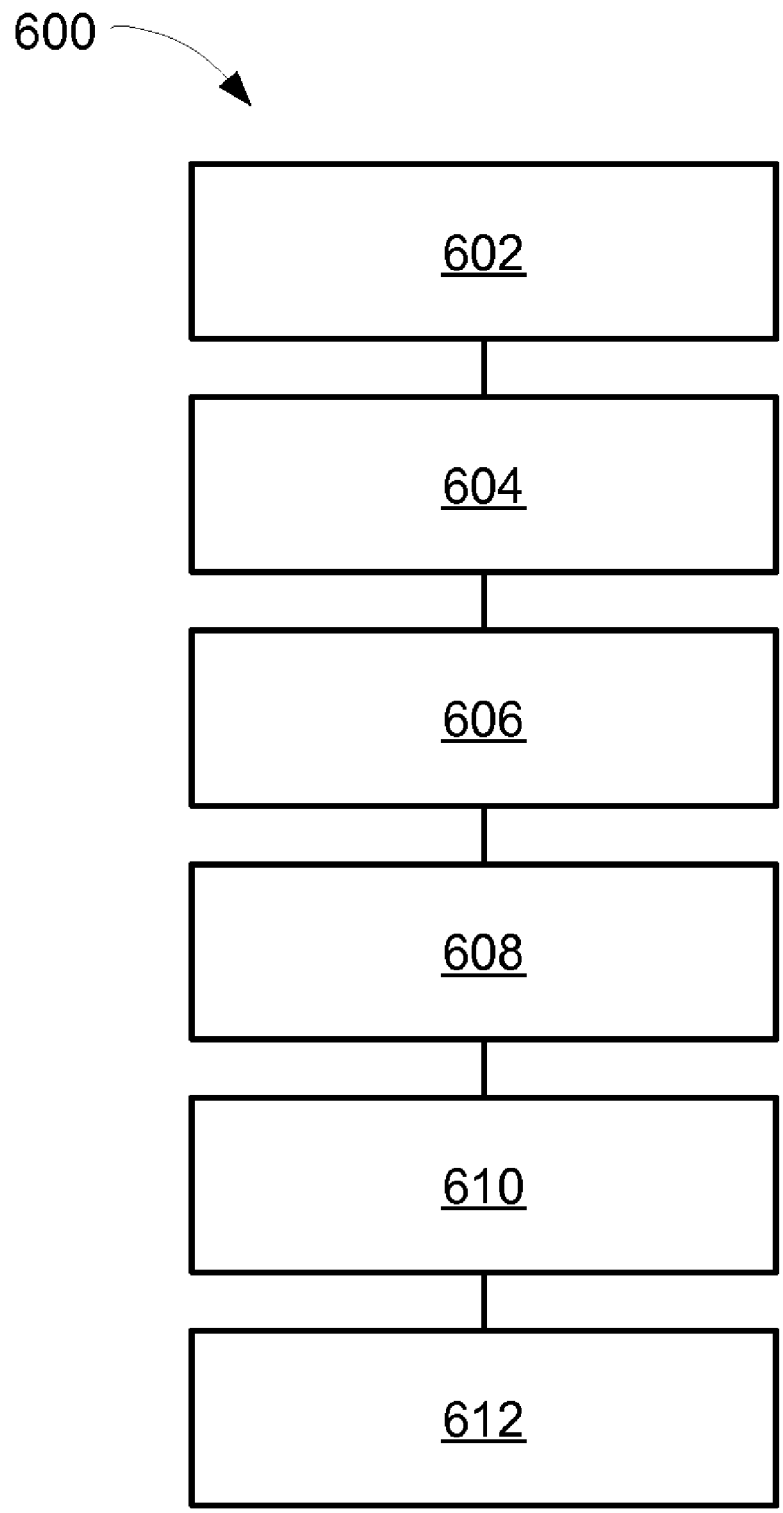
FIG. 6 is a flow chart of a system for wafer scale heat slug system, in an embodiment of the present invention.

Referring now to FIG. 6, therein is shown a flow chart of a heat slug system 600 for manufacturing the integrated circuit package assembly 400 in an embodiment of the present invention. The system 600 includes dicing an integrated circuit from a semiconductor wafer in a block 602; forming a heat slug blank equivalent in size to the semiconductor wafer in a block 604; dicing the heat slug blank to produce a heat slug equivalent in size to the integrated circuit in a block 606; attaching the integrated circuit to a substrate in a block 608; attaching the heat slug to the integrated circuit in a block 610; and encapsulating the integrated circuit in a block 612.

In greater detail, a method to fabricate the wafer scale heat slug system 100, according to an embodiment of the present invention, is performed as follows:

1. Dicing the integrated circuit 402 from a semiconductor wafer, wherein the dicing tool is a laser or a dicing saw. (FIG. 4)
2. Forming the heat slug blank 106 about the same size as the semiconductor wafer, wherein the heat slug blank 106 comprises a thermally conductive material. (FIG. 4)
3. Dicing the heat slug blank 106 into the heat slug 300 of equivalent size to the integrated circuit 402, wherein the dicing tool is a laser or a dicing saw. (FIG. 4)
4. Attaching the integrated circuit 402 to the substrate 404; (FIG. 4)
5. Attaching the heat slug 300 to the integrated circuit 402 with the thermal interface material 412; (FIG. 4)
6. Encapsulating the integrated circuit with the molding compound, wherein the molding compound providing structural integrity and protects the integrated circuit. (FIG. 4)

It has been discovered that the addition of a wafer scale heat slug attached to the integrated circuit has a significant impact on the reduction of junction temperature of the integrated circuit. This reduction in junction temperature translates into an increase in reliability of the integrated circuit.

It has been discovered that the present invention thus has numerous aspects.

An aspect is that the present invention significantly reduces the junction temperature of the integrated circuit attached to the heat slug. This aspect of the invention is achieved without developing any new tooling or fabrication materials. This invention also extends the useful application of existing integrated circuit manufacturing tools for adhesive application and chip attach.

Another aspect is that more densely packed circuitry can be packaged without trading off reliability of the integrated circuit.

Yet another important aspect of the present invention is that it valuably supports and services the historical trend of reducing costs, simplifying systems, and increasing performance.

These and other valuable aspects of the present invention consequently further the state of the technology to at least the next level.

Another aspect of the invention is that the same tools used in processing the semiconductor wafers can be used in processing the heat slug wafer.

Thus, it has been discovered that the wafer scale heat slug system method and apparatus of the present invention furnish important and heretofore unknown and unavailable solutions, capabilities, and functional aspects for packaging and operating integrated circuits with reduced junction temperatures. The resulting processes and configurations are straightforward, cost-effective, uncomplicated, highly versatile and effective, can be implemented by adapting known technologies, and are thus readily suited for efficiently and economically manufacturing high power integrated circuit devices that are fully compatible with conventional manufacturing processes and technologies. The resulting processes and configurations are straightforward, cost-effective, uncomplicated, highly versatile and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for manufacturing a wafer scale heat slug system comprising:
   dicing an integrated circuit from a semiconductor wafer;
   forming a heat slug blank equivalent in size to the semiconductor wafer;
   dicing the heat slug blank to produce a heat slug equivalent in size to the integrated circuit;
   attaching the integrated circuit to a substrate;
   attaching the heat slug to the integrated circuit; and
   encapsulating the integrated circuit.

2. The method as claimed in claim 1 further comprising using a thermal interface material between the heat slug and the integrated circuit.

3. The method as claimed in claim 1 wherein forming the heat slug blank equivalent in size to the semiconductor wafer comprises cold forging or chemically etching a blank sheet of thermally conductive material.

4. The method as claimed in claim 1 further comprising:
   forming the heat slug blank included forming a heat slug with a heat slug pedestal; and
   attaching the heat slug by the heat slug pedestal to the integrated circuit.

5. The method as claimed in claim 1 further comprising attaching a heat spreader to the integrated circuit, mounted as a flip chip on the substrate.

6. The method as claimed in claim 1 wherein dicing the heat slug blank includes mounting the heat slug blank on a wafer frame.

7. The method as claimed in claim 1 further comprising providing a dicing tape bonded between the wafer frame and the heat slug blank.

* * * * *